US010855175B2

(12) United States Patent
Kim et al.

(10) Patent No.: US 10,855,175 B2
(45) Date of Patent: Dec. 1, 2020

(54) HIGH VOLTAGE GENERATOR WITH PRECHARGE CONTROLLER

(71) Applicants: SK hynix Inc., Icheon (KR); INDUSTRY-UNIVERSITY COOPERATION FOUNDATION HANYANG UNIVERSITY, Seoul (KR)

(72) Inventors: Young-Il Kim, Seoul (KR); Sang-Sun Lee, Seoul (KR); Sung-Wook Choi, Anyang (KR)

(73) Assignees: SK hynix Inc., Icheon (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 30 days.

(21) Appl. No.: 15/933,830

(22) Filed: Mar. 23, 2018

(65) Prior Publication Data
US 2018/0212515 A1 Jul. 26, 2018

Related U.S. Application Data

(63) Continuation of application No. 14/337,020, filed on Jul. 21, 2014, now Pat. No. 9,960,672.

(30) Foreign Application Priority Data

Aug. 9, 2013 (KR) .................. 10-2013-0095049
Jun. 19, 2014 (KR) .................. 10-2014-0075164

(51) Int. Cl.
*H02M 3/07* (2006.01)
*H02M 1/36* (2007.01)
(Continued)

(52) U.S. Cl.
CPC ............. *H02M 3/07* (2013.01); *G11C 5/145* (2013.01); *H02M 1/36* (2013.01); *H02M 2001/0045* (2013.01)

(58) Field of Classification Search
None
See application file for complete search history.

(56) References Cited

U.S. PATENT DOCUMENTS

| 6,091,282 A | 7/2000 | Kim | |
|---|---|---|---|
| 2005/0213387 A1* | 9/2005 | Kubo | G11C 5/145 365/185.21 |

(Continued)

FOREIGN PATENT DOCUMENTS

| JP | 3735476 B2 | 1/2006 |
|---|---|---|
| KR | 10-2011-0047675 A | 5/2011 |

OTHER PUBLICATIONS

Ki-Tae Park et al., "Three-Dimensional 128Gb MLC Vertical NAND Flash Memory with 24-WL Stacked Layers and 50MB/s High-Speed Programming", IEEE International Solid-State Circuits Conference, 2014, pp. 1-26.

(Continued)

*Primary Examiner* — Jue Zhang
*Assistant Examiner* — Henry E Lee, III (57) ABSTRACT

A high voltage generator includes a voltage converting device configured to increase a level of an input voltage and output an output voltage having a level higher than the level of the input voltage. The high voltage generator also includes a precharge controller configured to gradually increase the level of the input voltage up to a level of an external voltage based on a reference voltage and the output voltage.

20 Claims, 5 Drawing Sheets

(51) Int. Cl.
*G11C 5/14* (2006.01)
*H02M 1/00* (2006.01)

(56) References Cited

U.S. PATENT DOCUMENTS

| | | | |
|---|---|---|---|
| 2006/0290414 A1* | 12/2006 | Kim | H02M 3/07 327/536 |
| 2011/0221513 A1* | 9/2011 | Fujisawa | G11C 5/145 327/536 |
| 2012/0249095 A1 | 10/2012 | Zhao et al. | |
| 2012/0293021 A1* | 11/2012 | Teggatz | H02J 7/35 307/151 |

OTHER PUBLICATIONS

"2014 Digest of Technical Papers", IEEE International Solid-State Conference, Feb. 2014, pp. 1-8, vol. 57, Mira Digital Publishing, St. Louis, Missouri, U.S.A.

* cited by examiner

FIG. 1

<PRIOR ART>

HIGH VOLTAGE GENERATOR WITH PRECHARGE CONTROLLER

CROSS-REFERENCES TO RELATED APPLICATIONS

This application is a continuation of U.S. application Ser. No. 14/337,020, filed on Jul. 21, 2014, which claims priority of Korean Patent Application Number 10-2013-0095049, filed on Aug. 9, 2013, and Korean Patent Application Number 10-2014-0075164, filed on Jun. 19, 2014, which are incorporated herein by reference in their entirety.

BACKGROUND

1. Technical Field

Embodiments of the present disclosure relate to a voltage generator, and more particularly, to a high voltage generator receiving an external voltage and generating a voltage higher than the external voltage.

2. Related Art

A flash memory device used for, e.g., a universal serial bus (USB) storage device or a solid state disk or solid state drive (SSD) storage device, uses a high voltage as a pass voltage or as a program voltage during its operation. Moreover, other electronic devices including display drivers may use a high voltage during their operation.

Figure 1:
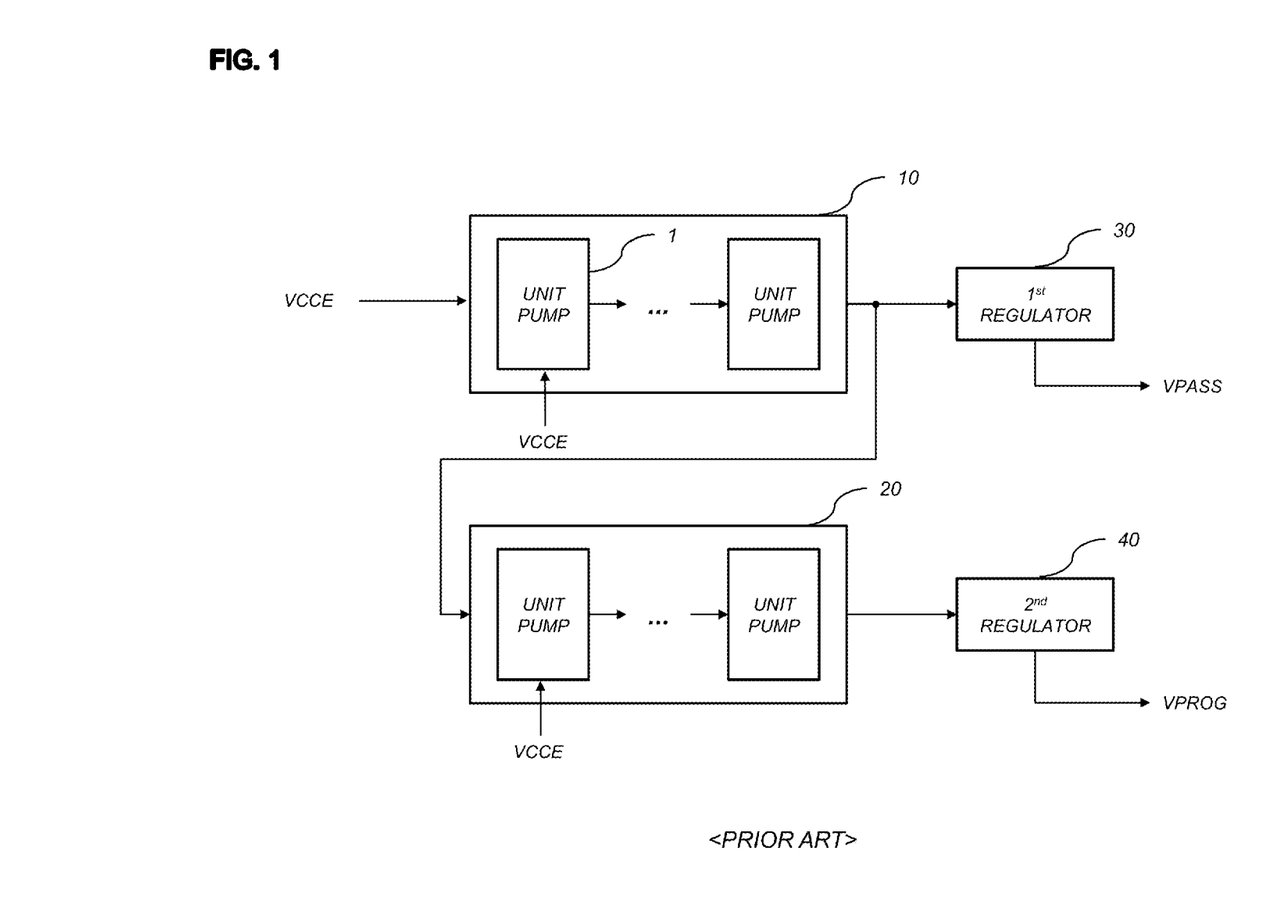
FIG. 1 illustrates a block diagram of a conventional high voltage generator.

FIG. 1 is a block diagram illustrating a conventional high voltage generator. The conventional voltage generator includes a first charge pumping device 10 configured to generate a first output voltage higher than an external source voltage VCCE, and a second charge pumping device 20 configured to generate a second output voltage higher than the first output voltage output from the first charge pumping device 10.

Each of the first charge pumping device 10 and the second charge pumping device 20 includes a plurality of unit pumps 1. Each unit pump 1 is driven by the external source voltage VCCE. Detailed descriptions of the configuration and operation of the unit pump 1 are omitted herein for illustrative convenience since the configuration and operation of a conventional unit pump 1 is well-known to those skilled in the art.

The conventional high voltage generator further includes a first regulator 30 configured to output a pass voltage VPASS by regulating the first output voltage of the first charge pumping device 10, and a second regulator 40 configured to output a program voltage VPROG by regulating the second output voltage of the second charge pumping device 20. The high voltage generator may generate a pass voltage VPASS in the range of 8~9 V and a program voltage VPROG in the range of 20~25 V using an external source voltage VCCE of 3.3 V.

The conventional high voltage generator uses a plurality of charge pumping devices, e.g., 10 and 20, connected in series and each of the charge pumping devices 10 and 20 includes a plurality of unit pumps. As a result, it is difficult to reduce a circuit area and increase power efficiency.

SUMMARY

In an embodiment of the present disclosure, a high voltage generator may include a voltage converting device configured to increase a level of an input voltage and output a high voltage having a level higher than the level of the input voltage; and a precharge controller configured to gradually increase the level of the input voltage up to a level of an external voltage based on a reference voltage and the output voltage.

In an embodiment, the precharge controller may include a voltage transmitting device configured to transmit the external voltage to an input node of the voltage converting device in response to a control signal; a reference voltage selector configured to generate a first control voltage based on a result of comparing the reference voltage and a first feedback voltage, the first feedback voltage being determined based on the output voltage; a first controller configured to control a voltage level of the control signal based on the first control voltage and a second control voltage, the second control voltage being determined based on the input voltage; and a second controller configured to control the voltage level of the control signal based on a result of comparing the first feedback voltage and the reference voltage.

In an embodiment, the high voltage generator may further include a discharging device configured to discharge the voltage converting device when the external voltage becomes lower than a predetermined voltage.

BRIEF DESCRIPTION OF THE DRAWINGS

Features, aspects, and embodiments are described in conjunction with the attached drawings, in which.

DETAILED DESCRIPTION

Hereinafter, a high voltage generator in accordance with embodiments will be described with reference to the accompanying drawings. Throughout the present disclosure, identical reference numerals refer to identical or similar parts throughout various figures and embodiments of the present disclosure.

Figure 2:
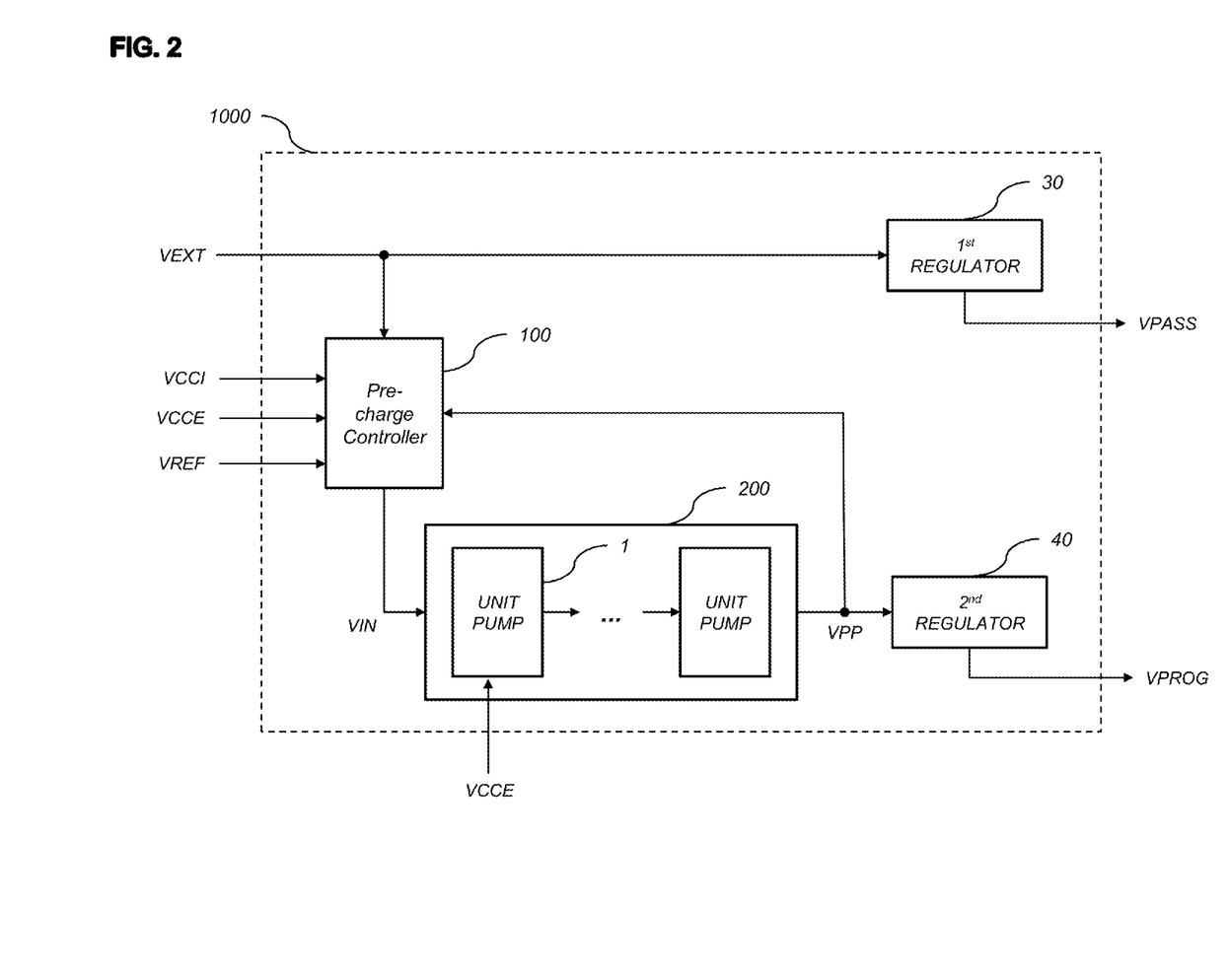
FIG. 2 illustrates a block diagram of a high voltage generator in accordance with an embodiment.

FIG. 2 is a block diagram of a high voltage generator 1000 in accordance with an embodiment of the present disclosure. The high voltage generator 1000 includes a precharge controller 100 configured to generate an input voltage VIN based on an external voltage VEXT. The high voltage generator 1000 also includes a voltage converting device 200 configured to generate a high voltage (or an output voltage) VPP based on the input voltage VIN.

The precharge controller 100 may use both an external source voltage VCCE and an internal source voltage VCCI, which is obtained by regulating the external source voltage VCCE. In an embodiment, the external voltage VCCE has 3.3V and the internal source voltage VCCI has 2.3V.

In an embodiment, the voltage converting device 200 includes a charge pumping device configured to increase a voltage level by pumping charges with a plurality of unit pumps 1.

The high voltage generator 1000 may further include a first regulator 30 configured to output a pass voltage VPASS by regulating the external voltage VEXT. The high voltage generator 1000 may also include a second regulator 40 configured to output a program voltage VPROG by regulating the output voltage VPP of the voltage converting device 200.

In an embodiment, the external voltage VEXT has 12V, which is higher than the external source voltage VCCE (e.g., 3.3 V). If the external voltage VEXT having a high voltage level (e.g., 12V) is abruptly provided to an input node of the voltage converting device 200, this may cause the breakdown of an input circuit of the voltage converting device 200. To prevent such a breakdown, the precharge controller 100 is provided between a node of the external voltage VEXT and the input node of the voltage converting device 200. As a result, the input circuit of the voltage converting device 200 may be protected if the external voltage VEXT having a high voltage level is abruptly provided.

The precharge controller 100 controls the generation of the input voltage VIN using a high voltage VPP output from the voltage converting device 200 and a reference voltage VREF.

In another embodiment, the precharge controller 100 may use a program voltage VPROG output from the second regulator 40, instead of the high voltage VPP. In still another embodiment, the precharge controller 100 may use an output voltage of a unit pump 1 included in the voltage converting device 200, instead of the high voltage VPP.

Figure 3:
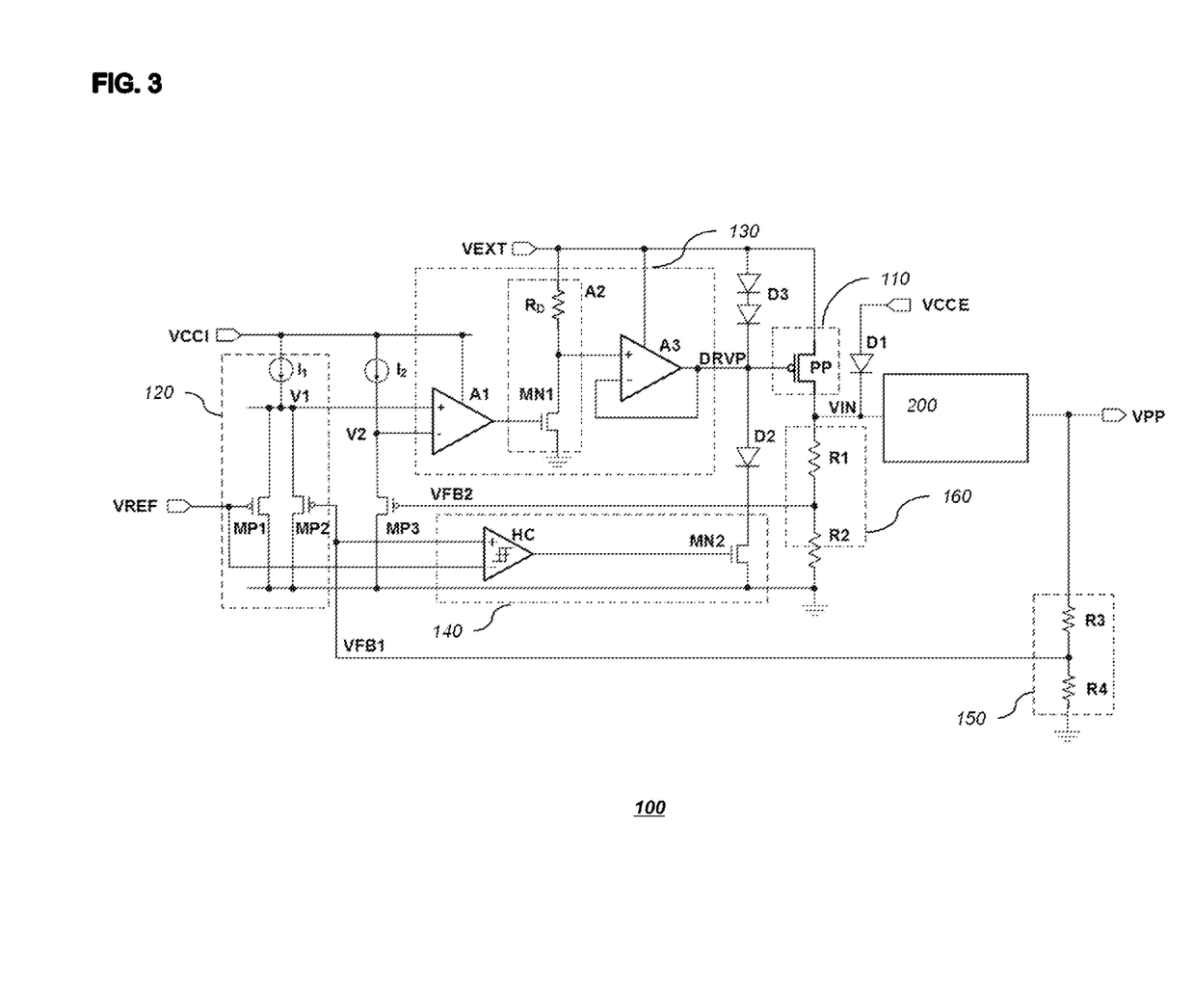
FIG. 3 illustrates a circuit diagram of a precharge controller in accordance with an embodiment.

FIG. 3 illustrates a circuit diagram of a precharge controller in accordance with an embodiment of the present disclosure. The precharge controller 100 includes a voltage transmitting device 110, a reference voltage selector 120, a first controller 130, and a second controller 140. The voltage transmitting device 110 is configured to transmit an external voltage VEXT as an input voltage VIN of the voltage converting device 200 according to a control signal DRVP. The reference voltage selector 120 is configured to output a first control voltage V1 by selecting one of a reference voltage VREF and a first feedback voltage VFB1, which is fed back from the voltage converting device 200. The first controller 130 is configured to control the voltage transmitting device 110 using the first control voltage V1 and a second control voltage V2. The second control voltage V2 is determined based on a second feedback voltage VFB2, which is fed back from the voltage transmitting device 110. The second controller 140 is configured to control the control signal DRVP using the reference voltage VREF and the first feedback voltage VFB1.

The precharge controller 100 may further include a first voltage divider 150 and a second voltage divider 160. The first voltage divider 150 is configured to output the first feedback voltage VFB1 by dividing a high voltage VPP output from the voltage converting device 200. The second voltage divider 160 is configured to output the second feedback voltage VFB2 by dividing the input voltage VIN output from the voltage transmitting device 110.

The first voltage divider 150 may include resistors R3 and R4 connected in series between an input node of the voltage converting device 200 and a ground voltage node, and the second voltage divider 160 may include resistors R1 and R2 connected in series between an output node of the voltage converting device 200 and the ground voltage node.

The first controller 130 may include a first amplifier A1 configured to amplify the difference between the first control voltage V1 and the second control voltage V2.

In an embodiment, the first amplifier A1 includes an operational amplifier using an internal source voltage VCCI as its driving voltage.

The first controller 130 may further include a second amplifier A2 configured to invert and amplify an output voltage of the first amplifier A1 using the external source voltage VEXT as its driving voltage.

In an embodiment, the second amplifier A2 includes a resistor RD and an NMOS transistor MN1, which are connected in series between a node of the external source voltage VEXT and the ground voltage node.

The first controller 130 may further include a third amplifier A3 for buffering an output voltage of the second amplifier A2 and outputting the control signal DRVP to the voltage transmitting device 110. In an embodiment, the third amplifier includes a unit gain amplifier.

The voltage transmitting device 110 may include a PMOS transistor PP having a gate to which the control signal DRVP is provided, a source that is connected to the node of the external source voltage VEXT, and a drain that is connected to the input node of the voltage converting device 200.

The second controller 140 may include a comparator HC for comparing the reference voltage VREF and the first feedback voltage VFB1 and an NMOS transistor MN2 whose gate voltage is controlled by the output of the comparator HC.

In an embodiment, the comparator HC includes a hysteresis comparator to reduce ripples, which may be generated when the difference between the reference voltage VREF and the first feedback voltage VFB1 is smaller than a threshold value.

The comparator HC may turn on the NMOS transistor MN2 when the difference between the first feedback voltage VFB1 and the reference voltage VREF is greater than the threshold value. As a result, a voltage level of the control signal DRVP is decreased proximate to a ground voltage level to fully turn on the voltage transmitting device 110.

At an initial stage in which a high voltage generator in accordance with an embodiment begins to operate, the first feedback voltage VFB1 is lower than the reference voltage VREF, and thus the NMOS transistor MN2 of the second controller 140 is turned off.

After that, if the first feedback voltage VFB1 increases and become higher than the reference voltage VREF, the NMOS transistor MN2 of the second controller 140 is turned on. As a result, the control signal DRVP is pulled down to the ground voltage level regardless of the output of the first controller 130.

The reference voltage selector 120 may output a first control voltage V1 based on the reference voltage VREF and the first feedback voltage VFB1. The reference voltage selector 120 may include a first current source $I_1$, a first PMOS transistor MP1, and a second PMOS transistor MP2. The first current source $I_1$ is connected to a node of the internal source voltage VCCI, which is lower than the external source voltage VCCE. The first PMOS transistor MP1 and the second PMOS transistor MP2 are connected in parallel between the first current source $I_1$ and the ground voltage node. The reference voltage VREF is provided to a gate of the first PMOS transistor MP1, and the first feedback voltage VFB1 is provided to a gate of the second PMOS transistor MP2.

In an embodiment, the first PMOS transistor MP1 and the second PMOS transistor MP2 are designed to have substantially the same specifications, for example, a threshold voltage, which is between 0.7V and 0.8V. If the first feedback voltage VFB1 is lower than the reference voltage VREF, the second PMOS transistor MP2 is turned on, and thus the first control voltage V1 is controlled in response to the first feedback voltage VFB1.

The first amplifier A1 amplifies a voltage difference between the first control voltage V1 from the reference voltage selector 120 and the second control voltage V2 determined according to the second feedback voltage VFB2 that depends on the input voltage VIN.

In an embodiment, the precharge controller 100 may further include a second current source $I_2$ and a third PMOS transistor MP3 which are connected in series between the node of the internal source voltage VCCI and the ground voltage node. The second feedback voltage VFB2 may be provided to a gate of the third PMOS transistor MP3.

The second control voltage V2 is a voltage at a node between the second current source $I_2$ and the third PMOS transistor MP3, and is controlled by the second feedback voltage VFB2.

The first feedback voltage VFB1 may be determined by a division ratio of the first voltage divider 150, and the second feedback voltage VFB2 may be determined by a division ratio of the second voltage divider 160. In an embodiment, the division ratio of the first voltage divider 150 is represented as a ratio of a resistance value of the third resistor R3 to the sum of the resistance values of the third and fourth resistors R3 and R4. In an embodiment, the division ratio of the first voltage divider 150 is 2.5 times greater than the division ratio of the second voltage divider 160. However, embodiments are not limited thereto.

In an embodiment, the first current source $I_1$ and second current source $I_2$ may have substantially the same specifications, and the first to third PMOS transistors MP1~MP3 may have substantially the same specifications.

The first feedback voltage VFB1 is a voltage that is fed back from the output node of the voltage converting device 200, and the second feedback voltage VFB2 is a voltage that is fed back from the input node of the voltage converting device 200. In an embodiment, the output voltage VPP is higher than the input voltage VIN, and the division ratio of the first voltage divider 150 is greater than the division ratio of the second voltage divider 160. Accordingly, the first feedback voltage VFB1 is higher than the second feedback voltage VFB2.

An operation of a high voltage generator in accordance with an embodiment will be described below in more detail with reference to FIG. 4.

Figure 4:
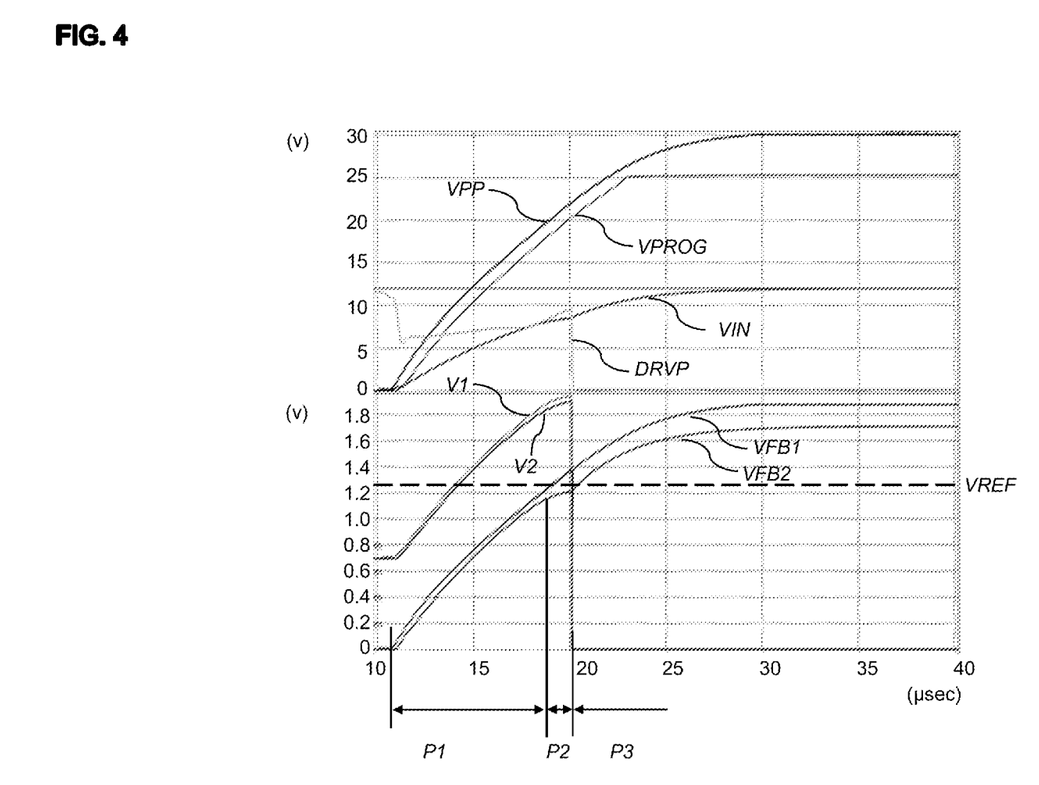
FIG. 4 is a graph illustrating an operation of a high voltage generator in accordance with an embodiment.

FIG. 4 is a graph illustrating an operation of a high voltage generator in accordance with an embodiment.

During a first period P1, if the voltage converting device 200 begins to operate, an output voltage VPP of the voltage converting device 200 and the first feedback voltage VFB1 gradually increase. However, during the first period P1, the first feedback voltage VFB1 remains lower than the reference voltage VREF. In an embodiment, the reference voltage VREF is 1.25V.

During the first period P1, since the first feedback voltage VFB1 is lower than the reference voltage VREF, the second PMOS transistor MP2 is turned on and the first PMOS transistor MP1 is turned off. Accordingly, when the output voltage VPP and the first feedback voltage VFB1 gradually increase, the first control voltage V1 gradually increases. Meanwhile, when the first control voltage V1 gradually increases, the second control voltage V2 gradually increases according to the second feedback voltage VFB2.

The first control voltage V1 is higher than the second control voltage V2 because of the voltage difference between the first feedback voltage VFB1 and the second feedback voltage VFB2. Therefore, an output voltage of the first amplifier A1 increases, and an output voltage of the second amplifier A2 acting as an inverter decreases, as shown in FIG. 4.

In an embodiment, the output voltage of the second amplifier A2 is provided to the voltage transmitting device 110 as a control signal DRVP via the third amplifier A3. The third amplifier A3 may be a unit gain amplifier.

Accordingly, when a voltage level of the control signal DRVP becomes lower than that of a threshold voltage of the PMOS transistor PP, the voltage transmitting device 110 is turned on and provides a voltage substantially equal to the external voltage VEXT to an input node of the voltage converting device 200. As a result, an input voltage VIN of the voltage converting device 200 increases, and thus the output voltage VPP of voltage converting device 200 increases at a faster rate than the input voltage VIN, as shown in FIG. 4.

The positive feedback operation described above continues until the first feedback voltage VFB1 becomes higher than the reference voltage VREF.

During a second period P2, the first feedback voltage VFB1 becomes higher than the reference voltage VREF. During this period, the second PMOS transistor MP2 is turned off, and the first PMOS transistor MP1 is turned on. As a result, the first control voltage V1 is gradually saturated.

During the second period P2, the second control voltage V2 is also gradually saturated. Therefore, the output voltage of the first amplifier A1, the output voltage of the second amplifier A2, and the input voltage VIN of the voltage converting device 200 become saturated. On the other hand, the output voltage VPP of the voltage converting device 200 continues to increase due to a charge pumping operation, and thus the first feedback voltage VFB1 continues to increase as shown in FIG. 4.

A third period P3 starts when the difference between the first feedback voltage VFB1 and the reference voltage VREF becomes higher than a threshold value.

During the third period P3, the output of the comparator HC of the second controller 140 has a logic high value HIGH to turn on the NMOS transistor MN2. As the NMOS transistor MN2 is turned on, the gate voltage DRVP has a voltage level corresponding to a logic low value LOW. As a result, the voltage transmitting device 110 is fully turned on, and a level of the input voltage VIN becomes substantially the same as that of the external voltage VEXT.

As mentioned, the precharge controller 100 operates to gradually transmit the external voltage VEXT to the input node of the voltage converting device 200, while a predetermined period elapses after the high voltage generator 1000 starts to operate. As a result, the input voltage VIN of the voltage converting device 200 gradually increases to prevent breakdown of an input circuit of the voltage converting device 200.

Since the external voltage VEXT has a relatively high level (e.g., 12V), a voltage difference between a source and a drain, a voltage difference between a gate and a drain, and/or a voltage difference between a gate and a source of the PMOS transistor PP may be higher than a breakdown voltage of the PMOS transistor PP.

In order to address this issue, the precharge controller 100 may further include a first protection diode D1, a second protection diode D2, and a third protection diode D3 as shown in FIG. 3.

The first protection diode D1 is connected between the drain of the PMOS transistor PP and a node of the external source voltage VCCE. The first protection diode D1 is turned on at an initial stage so that a drain voltage of the PMOS transistor PP can be precharged to a voltage which is substantially equal to a voltage that is lower than the external source voltage VCCE by a turn-on voltage of the first protection diode D1. Therefore, the voltage difference between the source and the drain of the PMOS transistor PP may be kept below the breakdown voltage of the PMOS transistor PP.

The second protection diode D2 is connected between the gate of the PMOS transistor PP and a drain of the NMOS transistor MN2. The second protection diode D2 is turned on when the NMOS transistor NM2 is turned on, so that the voltage of the gate of the PMOS transistor PP is kept at a voltage level that is substantially equal to a turn-on voltage of the second protection diode D2. Therefore, the voltage difference between the gate and the source of the PMOS transistor PP may be kept below the breakdown voltage of the PMOS transistor PP.

The third protection diode D3 is connected between the gate of the PMOS transistor PP and the node of the external voltage VEXT. The third protection diode D3 is turned on when the voltage of the gate of the PMOS transistor PP drops abruptly, so that the voltage of the gate of the PMOS transistor PP may be kept at a voltage level, which corresponds to a voltage that is lower than the external voltage VEXT by a turn-on voltage of the third protection diode D3. In an embodiment, the third protection diode D3 includes a plurality of diodes connected to each other in series and the turn-on voltage of the third protection diode D3 corresponds to the sum of turn-on voltages of the plurality of diodes. Therefore, the voltage difference between the gate and the drain of the PMOS transistor PP may be kept below the breakdown voltage of the PMOS transistor PP.

The second protection diode D2 and the third protection diode D3 are not turned on simultaneously to prevent formation of a current path between the node of the external voltage VEXT and the ground voltage node.

The first to third protection diodes D1~D3 may include one or more normal diodes or Zener diodes, which are connected to each other in series and/or in parallel.

Figure 5:
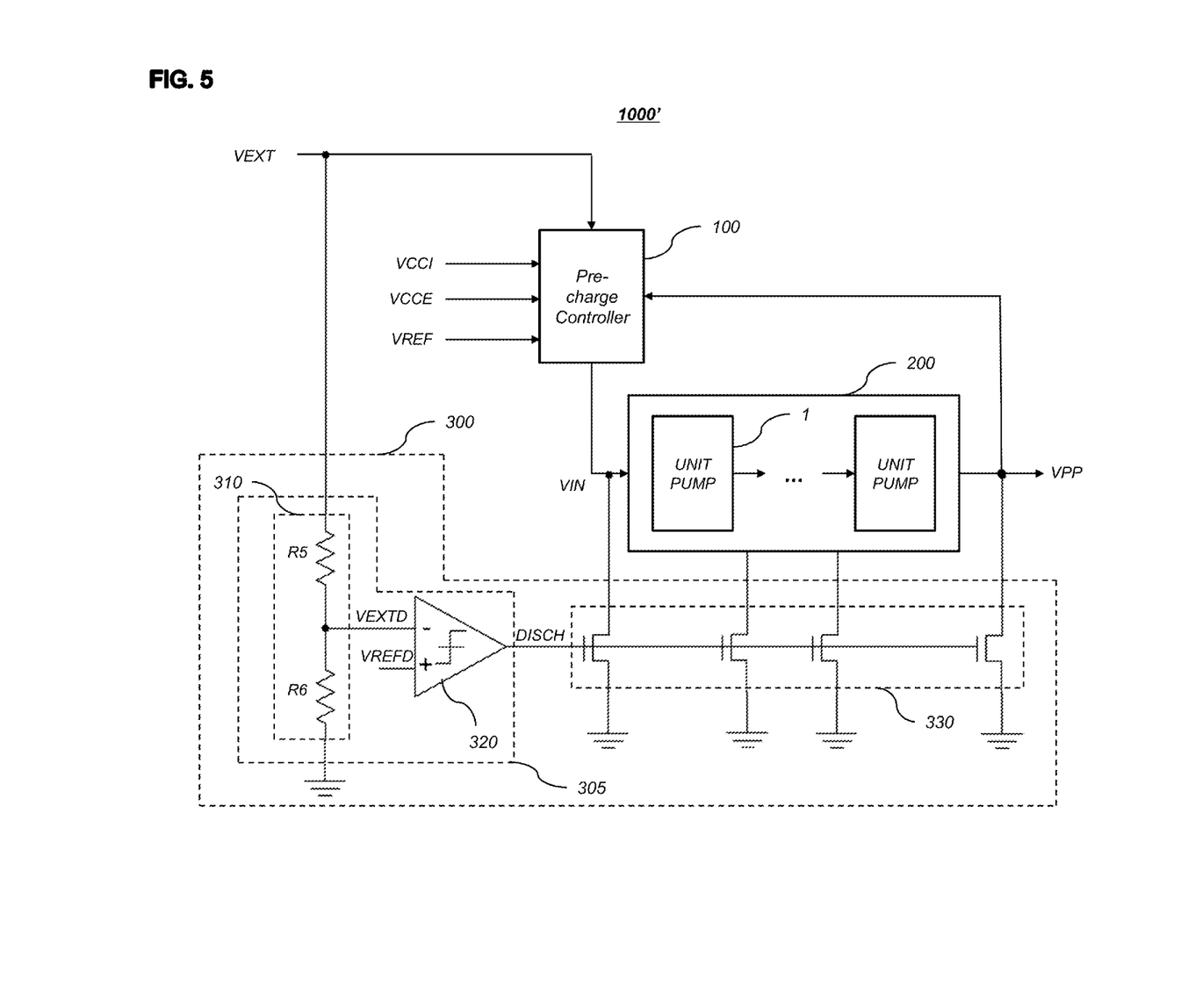
FIG. 5 illustrates a block diagram of a high voltage generator in accordance with another embodiment.

FIG. 5 illustrates a high voltage generator 1000' in accordance with another embodiment of the present disclosure.

The precharge controller 100 and the voltage converting device 200 of FIG. 5 have substantially the same configuration as described with reference to FIG. 3. However, the high voltage generator 1000' of FIG. 5 further includes a discharging device 300.

The discharging device 300 discharges the voltage converting device 200 when a discharge sensing voltage VEXTD that is proportional to the external voltage VEXT becomes lower than a discharge reference voltage VREFD to prevent breakdown of the voltage converting device 200.

The discharging device 300 may include a discharge controller 305. The discharge controller 305 includes a voltage divider 310 and a comparator 320. The voltage divider 310 is configured to output the discharge sensing voltage VEXTD by dividing the external voltage VEXT with resistors R5 and R6. The comparator 320 is configured to output a discharge control signal DISCH by comparing the discharge reference voltage VREFD and the discharge sensing voltage VEXTD. The discharging device 300 further includes a discharge switching device 330, which is controlled by the discharge control signal DISCH.

The comparator 320 activates the discharge control signal DISCH when the discharge sensing voltage VEXTD becomes lower than the discharge reference voltage VREFD.

The discharge switching device 330 may include a plurality of NMOS transistors, which are connected to nodes of unit pumps 1 included in the voltage converting device 200, and may be turned on when the discharge control signal DISCH is activated to discharge each node of the unit pumps 1.

Therefore, when the external voltage VEXT abruptly transitions to a low level, the voltage converting device 300 may be activated to prevent breakdown of the voltage converting device 200.

The above embodiments of the present disclosure are illustrative and not limitative. Various alternatives and equivalents are possible. The present invention is not limited by the embodiments described herein. Other additions, subtractions, or modifications are obvious in view of the present disclosure and are intended to fall within the scope of the appended claims.

What is claimed is:

1. A high voltage generator comprising:
   a voltage converting device configured to generate an output voltage by pumping an input voltage, the output voltage having a level higher than a level of the input voltage; and
   a precharge controller configured to generate the input voltage based on an external voltage, a reference voltage, and the output voltage of the voltage converting device and provide the input voltage to an input node of the voltage converting device while preventing breakdown of a circuit in the voltage converting device receiving the input voltage,
   wherein the precharge controller comprises a voltage transmitting device configured to output the input voltage according to a control signal, and
   wherein the precharge controller increases the level of the input voltage from a first level that is lower than a level of the external voltage to a second level that is substantially equal to the level of the external voltage.

2. The high voltage generator according to claim 1, wherein the precharge controller comprises:
   a reference voltage selector configured to generate a first control voltage based on a result of comparing the reference voltage and a first feedback voltage, the first feedback voltage being determined based on the output voltage;
   a first controller configured to control a voltage level of the control signal based on the first control voltage and a second control voltage, the second control voltage being determined based on the input voltage; and
   a second controller configured to control the voltage level of the control signal based on a result of comparing the first feedback voltage and the reference voltage.

3. The high voltage generator according to claim 2, further comprising:
   a first voltage divider configured to generate the first feedback voltage by dividing the output voltage; and
   a second voltage divider configured to generate a second feedback voltage by dividing the input voltage.

4. The high voltage generator according to claim 2, wherein the first controller comprises:
   a first amplifier configured to amplify a difference between the first control voltage and the second control voltage; and
   a second amplifier configured to amplify an output voltage of the first amplifier.

5. The high voltage generator according to claim 4, wherein the first controller further comprises:

a third amplifier configured to buffer an output voltage of the second amplifier.

6. The high voltage generator according to claim 2, wherein the second controller comprises:
a comparator configured to compare the first feedback voltage and the reference voltage; and
a switching element configured to control the voltage level of the control signal in response to an output of the comparator.

7. The high voltage generator of claim 2, wherein the reference voltage selector comprises:
a first current source connected to a node of an internal source voltage having a level lower than the level of the external voltage;
a first switching element connected between the first current source and a ground voltage node and controlled by the reference voltage; and
a second switching element connected between the first current source and the ground voltage node and controlled by the first feedback voltage.

8. The high voltage generator of claim 7, further comprising:
a second current source connected between the node of the internal source voltage and a third switching element; and
the third switching element connected between the second current source and the ground voltage node and controlled by a second feedback voltage.

9. The high voltage generator of claim 2, wherein the voltage transmitting device includes a PMOS transistor having a source connected to the node of the external voltage, a drain connected to the input node of the voltage converting device, and a gate receiving the control signal.

10. The high voltage generator of claim 9, wherein the precharge controller further comprises a first protection diode connected to the drain of the PMOS transistor.

11. The high voltage generator of claim 9, wherein the precharge controller further comprises a second protection diode connected between the gate of the PMOS transistor and the second controller.

12. The high voltage generator of claim 10, wherein the precharge controller further comprises a third protection diode connected between the node of the external voltage and the gate of the PMOS transistor.

13. The high voltage generator of claim 12, wherein the second protection diode and the third protection diode are not turned on simultaneously.

14. The high voltage generator of claim 1, further comprising:
a discharging device configured to discharge the voltage converting device when the external voltage becomes lower than a predetermined voltage.

15. The high voltage generator of claim 14, wherein the discharging device comprises:
a discharge controller configured to output a discharge control signal based on the external voltage and the predetermined voltage; and
a discharge switching device configured to form a discharge path between the voltage converting device and a ground voltage node.

16. The high voltage generator of claim 15, wherein the discharge controller includes:
a voltage divider configured to output a discharge sensing voltage by dividing the external voltage; and
a comparator configured to compare the discharge sensing voltage and a discharge reference voltage and output the discharge control signal.

17. The high voltage generator of claim 15, wherein the voltage converting device includes a plurality of unit pumps, and
wherein the discharge switching device includes a plurality of MOS transistors, each of which has a gate connected to the discharge control signal, a source connected to the ground voltage node, and a drain connected to a node of each of the unit pumps.

18. The high voltage generator according to claim 1, wherein the precharge controller receives the external voltage and provides the input voltage to the voltage converting device.

19. The high voltage generator according to claim 1, wherein the precharge controller is disposed between a node of the external voltage and the input node of the voltage converting device.

20. The high voltage generator according to claim 1, wherein the precharge controller keeps the level of the input voltage at the second level during a given time interval after the level of the input voltage has increased to the second level.

* * * * *